United States Patent
Varadarajan et al.

(10) Patent No.: US 12,085,610 B2
(45) Date of Patent: Sep. 10, 2024

(54) METHODS AND APPARATUS TO IDENTIFY FAULTS IN PROCESSORS

(71) Applicant: Texas Instruments Incorporated, Dallas, TX (US)

(72) Inventors: Devanathan Varadarajan, Allen, TX (US); Benjamin Niewenhuis, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/877,607

(22) Filed: Jul. 29, 2022

(65) Prior Publication Data
US 2023/0324456 A1 Oct. 12, 2023

Related U.S. Application Data

(60) Provisional application No. 63/329,623, filed on Apr. 11, 2022.

(51) Int. Cl.
*G01R 31/317* (2006.01)
*G01R 31/3177* (2006.01)
(Continued)

(52) U.S. Cl.
CPC .......... *G01R 31/31703* (2013.01); *G01R 31/3177* (2013.01); *G01R 31/2851* (2013.01);
(Continued)

(58) Field of Classification Search
CPC ...... G01R 31/31703; G01R 31/318566; G01R 31/318586; G01R 31/31724;
(Continued)

(56) References Cited

U.S. PATENT DOCUMENTS 11,592,482 B1* 2/2023 Chillarige ...... G01R 31/318547
2014/0372822 A1* 12/2014 Saikia ................ G01R 31/3177
714/727

OTHER PUBLICATIONS

Dattatraya et al. "Silent Data Corruptions at Scale", Feb. 22, 2021, 8 pages.

(Continued)

*Primary Examiner* — April Y Blair
*Assistant Examiner* — Sazzad Hossain
(74) *Attorney, Agent, or Firm* — Brian D. Graham; Frank D. Cimino

(57) ABSTRACT

An example device includes built in test observation controller circuitry configured to: obtain a test; send first instructions to the processor to begin to execute the test by modifying values stored in a plurality of memory circuits; send second instructions to the processor to stop execution of the test at a first simulation time, wherein one or more memory values that are unobservable during a second simulation time of the test execution are observable during the first simulation time; and enhanced chip access trace scan circuitry configured to select a subset of the values from the plurality of memory circuits while the test is stopped; and signature circuitry configured to: determine a logic signature based on the subset of the values; and provide the logic signature for comparison to an expected signature, wherein a difference between the logic signature and the expected signature corresponds to a fault in the processor.

20 Claims, 9 Drawing Sheets

(51) Int. Cl.
  *G01R 31/28* (2006.01)
  *G01R 31/3185* (2006.01)
(52) U.S. Cl.
  CPC .......... *G01R 31/31724* (2013.01); *G01R 31/318536* (2013.01); *G01R 31/318547* (2013.01); *G01R 31/318566* (2013.01); *G01R 31/318586* (2013.01)
(58) Field of Classification Search
  CPC ........ G01R 31/3177; G01R 31/318536; G01R 31/318547; G01R 31/2851
  See application file for complete search history.

(56) References Cited

OTHER PUBLICATIONS

Hochschikd et al. "Cores that Don't Count", May 31, 2021-Jun. 2, 2021, 8 pages.
Apello et al. "System-Level Test: State of the Art and Challenges", Jul. 26, 2021, 3 pages. (Abstract only).
Song et al. "A low power open multimedia application platform for 3G wireless", Nov. 3, 2003, 3 pages. (Abstract Only).

* cited by examiner

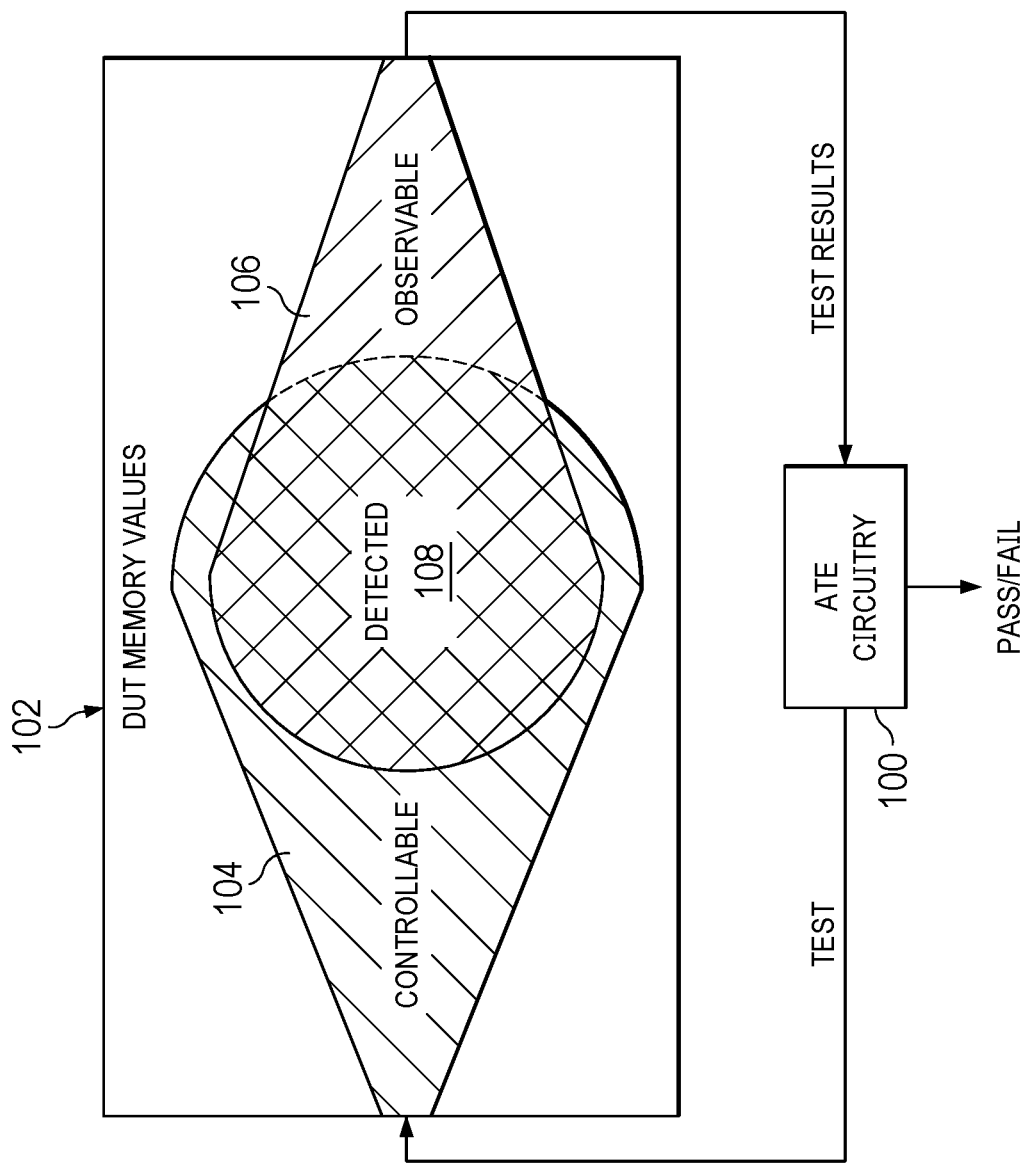

METHODS AND APPARATUS TO IDENTIFY FAULTS IN PROCESSORS

CROSS-REFERENCE TO RELATED APPLICATION

This patent application claims the benefit of and priority to U.S. Provisional Patent Application Ser. No. 63/329,623 filed Apr. 11, 2022, which application is hereby incorporated herein by reference in its entirety.

TECHNICAL FIELD

This description relates generally to processors, and more particularly to methods and apparatus to identify faults in processors.

BACKGROUND

Processors are used to perform a wide variety of functions across multiple industries. In some industries, processors may be required to meet strict quality requirements. The quality requirements may be used to ensure a processor can be used in a vehicle with specific safety standards. For example, in the automotive industry, some processors may be required to have at or near 0 defective parts per million (DPPM).

SUMMARY

For methods and apparatus to identify faults in processors, an example device includes built in test observation controller circuitry configured to: obtain a test; send first instructions to the processor to begin to execute the test by modifying values stored in a plurality of memory circuits; send second instructions to the processor to stop execution of the test at a first simulation time, wherein one or more memory values that are unobservable during a second simulation time of the test execution are observable during the first simulation time; and enhanced chip access trace scan circuitry configured to select a subset of the values from the plurality of memory circuits while the test is stopped; and signature circuitry configured to: determine a logic signature based on the subset of the values; and provide the logic signature for comparison to an expected signature, wherein a difference between the logic signature and the expected signature corresponds to a fault in the processor.

BRIEF DESCRIPTION OF THE DRAWINGS

FIG. 1 an illustrative example of controllable, observable, and detected memory values of a device under test (DUT).

The same reference numbers or other reference designators are used in the drawings to designate the same or similar (functionally and/or structurally) features.

DETAILED DESCRIPTION

Figure 2A:
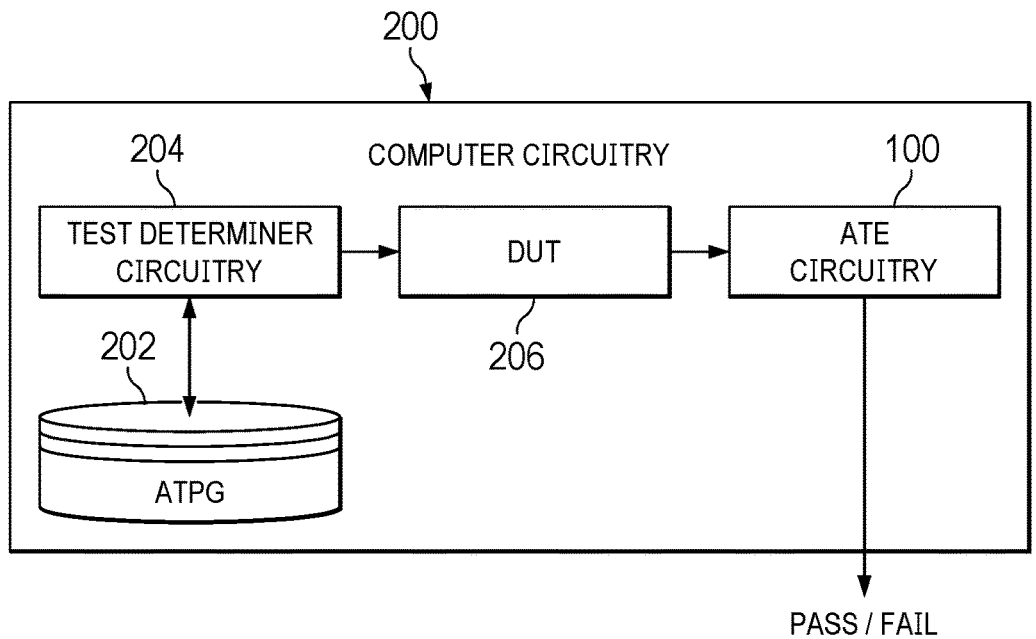
FIG. 2A is an example block diagram of first computer circuitry configured to evaluate an example DUT.

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Manufacturers may rely on functional Design Verification (DV) tests to determine if a processor meets the safety requirements required for use in a product. A functional DV test is a test that verifies a design conforms to its specification and performs its intended action. In many examples, Automatic Test Equipment (ATE) performs a DV test on a DUT.

One manner in which an ATE may quantify the performance of a DUT is to measure the number of faults that occur during a test. In some examples, the ATE measures a stuck-at fault. A stuck-at fault refers to a signal that remains at a given logic state (i.e., a logical '1' or logical '0') despite instructions from a test program to switch logic states. A signal that exhibits such behavior may be referred to as 'stuck' on a logic state. In some examples, the percentage of stuck-at faults within a DUT that an ATE can identify may be referred to as stuck-at coverage. Manufacturers in the automotive industry and other industries with strict safety requirements may require that an ATE compute a stuck-at coverage greater than 99% in order to use the DUT in a product. As used above and herein, a memory circuit refers to a single flip flop circuit used to store one bit (i.e., voltages representative of a logical '1' or a logical '0').

FIG. 1 is an illustrative example of controllable, observable, and detected memory values of a device under test (DUT). FIG. 1 includes example ATE circuitry 100, DUT memory values 102, example controllable memory values 104, example observable memory values 106, and example detectable memory values 108.

The example ATE circuitry 100 measures the performance of an example DUT. To measure the performance, the example ATE circuitry 100 provides a test to the example DUT. The test may be, for example, a DV program that instructs the DUT to perform a series of operations. The example ATE circuitry 100 may provide different types of test stimuli to various DUTs based on the characteristics and expected behavior of each DUT.

The example ATE circuitry 100 also obtains results of the test stimuli from the example DUT. The example ATE circuitry 100 may, for each bit within the test results, determine whether the bit matches a bit from an expected results of the test stimuli. If the test results bit matches the expected results bit, the example ATE circuitry 100 determines that the memory circuit used to store the bit passes the test. Similarly, if the test results bit does not match the expected results bit, the example ATE circuitry 100 determines the memory circuit used to store the bit has exhibited a stuck-at fault and fails the test. The example ATE circuitry 100 is discussed further in connection with FIG. 2A.

The example DUT memory values 102 represents all of the memory circuits within the example DUT. The example DUT memory values 102 may be mathematically represented as a whole set from which subsets (i.e., the example controllable memory values 104, the example observable memory values 106, and the example detectable memory values 108) are formed.

The example controllable memory values 104 refer to the set of memory circuits within the example DUT memory values 102 that are influenced by the test stimuli. For example, suppose the ATE circuitry 100 provides a test stimuli that requires the example DUT to add two integer variables together and store the summation as a third integer variable. In such an example, the controllable memory values 104 would include every memory circuit that stores a bit used to represent one of the three variables. The number of values in the set of controllable memory values 104 may change based on the type of DUT and the type of test stimuli.

When a DUT performs operations in response to the test stimuli, some values in DUT memory values 102 will not match an expected value due to one or more faults in the processor circuitry 304. Similarly, other values in the DUT memory values 102 will match an expected value after a response to test stimuli. However, a given test stimuli may enable the example ATE circuitry 100 to determine whether a fault occurred in only a portion of the memory circuits of a DUT. For example, for any given test pattern, certain memory circuits may not be accessed and other memory circuits may be accessed in a manner in which it is not possible to determine whether the value at the end of the test is due to proper operation or a stuck-at fault. The example observable memory values 106 refer to the set of memory circuits within the example DUT where the ATE circuitry 100 is capable of determining whether or not the memory circuits have experienced a fault. In some examples, a memory value may be referred to as observed, measured, recorded, and/or strobed if a corresponding fault status can be determined by the example ATE circuitry 100. Similarly, memory values for which the ATE circuitry 100 is incapable of determining whether a fault occurred (i.e., the set of the DUT memory values 102 that excludes the observable memory values 106) may be referred to as unobservable memory values.

In the illustrative example of FIG. 1, the inclusion of a memory value in multiple sets is shown when the shaded areas that represent those sets overlap. For example, all of the example observable memory values 106 are also DUT memory values 102. However, some example observable memory values 106 are not considered example controllable memory values 104. Memory values that are observable but not controllable may refer to signals that are unaffected by the test stimuli and/or do not experience a fault that was measurable by the example ATE circuitry.

The example detectable memory values 108 refer to the set of memory circuits within the example controllable memory values 104 that are also within the example observable memory values 106. Memory values that are both controllable and observable refer to bits that were both influenced by test stimuli and obtained by the example ATE circuitry 100.

The example ATE circuitry 100 may only make pass/fail determinations for memory circuits within the example detectable memory values 108. The ATE circuitry 100 may not make pass/fail determinations for memory values that are observable but not controllable because the memory circuits are not influenced by the test stimuli and therefore do not store bits that can be considered test results. Furthermore, the set of example observable memory values 106 may contain fewer memory circuits than the set of example controllable memory values 104. In some examples, a low amount of observable memory values 106 from a test stimulus may result in a DUT with a stuck-at coverage that is less than 99% and/or result in the DUT being unable to meet safety requirements for use in the automotive industry.

Advantageously, example methods, systems, and apparatus described herein increase observable memory values in an example DUT. Example test controller circuitry identifies a test for a processor and runs the test on the processor, causing the processor to modify values stored in a plurality of memory circuits. During a first execution of the test, example window determiner circuitry identifies an observable time window. During a second execution of the test, BITO controller circuitry stops the test at the start of the observable time window, selects a subset of values from the plurality of memory circuits, and determines a logic signature based on the subset of values. Example ATE circuitry compares the logic signature with an expected signature for fail detection and identifies a difference between the logic signature and expected signature as a fault in the processor.

FIG. 2A is an example block diagram of computer circuitry configured to evaluate DUT circuitry. FIG. 2A includes example computer circuitry 200, an example Automatic Test Pattern Generator (ATPG) database 202, example test determiner circuitry 204, an example DUT 206, and example ATE circuitry 100.

The example computer circuitry 200 measures the performance of the example DUT 206. In the example block diagram of FIG. 2A, the example DUT 206 is implemented within the example computer circuitry 200. In other examples, the example DUT 206 is an external device.

The example ATPG database 202 stores DV tests that are created using automatic test pattern generation techniques. The tests stored within the example ATPG may be designed for any type of DUT and may verify any type of functionality. In some examples, the computer circuitry 200 includes compute resources that execute ATPG techniques to populate the ATPG database. In other examples, the example computer circuitry 200 receives DV tests from an external source and stores the tests in the ATPG database.

The example ATPG database 202 is implemented by any memory, storage device and/or storage disc for storing data such as, for example, flash memory, magnetic media, optical media, solid state memory, hard drive(s), thumb drive(s), etc. Furthermore, the data stored in the ATPG database 202 may be in any data format such as, for example, binary data, comma delimited data, tab delimited data, structured query language (SQL) structures, etc. While, in the illustrated example, the ATPG database 202 is illustrated as a single device, the ATPG database 202 and/or any other data storage devices described herein may be implemented by any number and/or type(s) of memories.

The example test determiner circuitry 204 determines a DV test to run on the example DUT 206. The example test determiner circuitry 204 may select the DV test from a test stored in the example ATPG database 202. The DV test may include machine readable instructions that cause the DUT 206 to perform operations based on one or more intended purposes. In some examples, the example test determiner circuitry 204 may select a DV test based on a specification sheet of the example DUT 206. The example test determiner circuitry 204 may select a DV test that is written in any programming language, includes any number of instructions, etc.

The example DUT 206 is an electronic device configured to perform operations based on machine readable instructions. The example DUT 206 may include, for example, programmable microprocessors, Field Programmable Gate Arrays (FPGAs) that may instantiate instructions, Central Processor Units (CPUs), Graphics Processor Units (GPUs), Digital Signal Processors (DSPs), or microcontrollers and integrated circuits such as Application Specific Integrated Circuits (ASICs). In some examples, the example DUT 206 may be a device such as a System on a Chip (SoC) that includes multiple compute resources. In some examples, the DUT 206 may additionally or alternatively be considered an intellectual property (IP) core.

The example DUT 206 modifies the selected DV test in accordance with the teachings of this disclosure. The modified test checks for the same functionality that the selected DV test checks for. Advantageously, the modified test checks for the functionality in a technique that results in more observable memory values than the technique used by the selected DV test. The example DUT 206 provides the results of the modified test to the example ATE circuitry 100. The example DUT 206 is discussed further in connection with FIG. 3.

The example ATE circuitry 100 compares the results of the modified test to a set of expected results. As described in FIG. 1, the example ATE circuitry 100 determines whether each memory circuit in the example DUT 206 passes or fails by determining if the results of the modified test match the expected results. The example ATE circuitry 100 may share the pass/fail determinations in any manner. For example, the ATE circuitry 100 may provide the results to a graphics engine for presentation on a display, may provide the results to transceiver circuitry for communication over a network, etc.

The example computer circuitry 200 includes an example DUT 206 to modify a DV test according to the teachings of this disclosure. The modified test increases the observability of the selected DV test. As a result, the example ATE circuitry 100 makes a greater number of pass/fail determinations, thereby increasing the stuck-at coverage rate. In some examples, the increased stuck-at coverage rate produced due to the modified test may result in the example DUT 206 meeting a set of automotive safety-requirements.

Figure 2B:
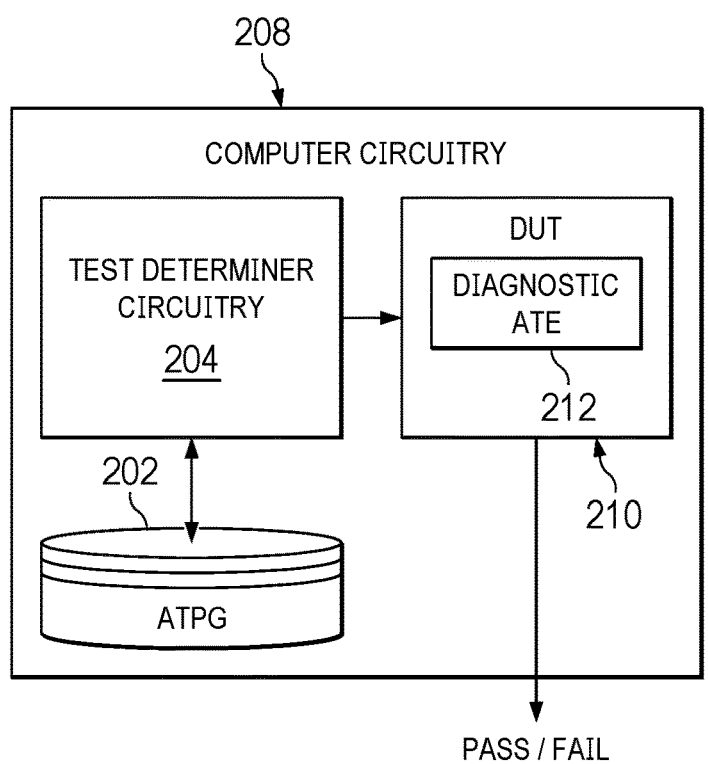
FIG. 2B is an example block diagram of second computer circuitry configured to evaluate an example DUT.

FIG. 2B is an example block diagram of computer circuitry configured to evaluate an example DUT. FIG. 2B includes example computer circuitry 208. The example computer circuitry 208 includes the example ATPG database 202, the example test determiner circuitry 204, and an example DUT 210. The example DUT 210 includes example diagnostic ATE circuitry 212.

The example computer circuitry 208 measures the performance of the example DUT 210. In the example block diagram of FIG. 2B, the example DUT 210 is implemented within the example computer circuitry 208. In other examples, the example DUT 210 is an external device.

Like the example DUT 206, the example DUT 210 is an electronic device configured to perform operations based on machine readable instructions. The example DUT 206 may include, for example, programmable microprocessors, Field Programmable Gate Arrays (FPGAs) that may instantiate instructions, Central Processor Units (CPUs), Graphics Processor Units (GPUs), Digital Signal Processors (DSPs), or microcontrollers and integrated circuits such as Application Specific Integrated Circuits (ASICs).

Like the example DUT 206, the example DUT 210 also runs a modified version of the selected DV in accordance with the teachings of this disclosure. The example DUT 210 may be implemented with the same or similar components as the example DUT 206. However, rather than providing the measured signature and expected signatures to external ATE circuitry 100, internal components the example DUT 210 provide signatures to the internal diagnostic ATE circuitry 212 to make pass/fail determinations.

In contrast to the DUT 206, the example DUT 210 includes diagnostic ATE circuitry 212. The example diagnostic ATE circuitry 212 is an example implementation of the example ATE circuitry 100 that is internal to the example DUT 210. That is, the example diagnostic ATE circuitry 212 obtains a measured signature based on the modified memory circuits of the example DUT 210, compares the measured signature to an expected signature, and generates pass/fail determinations for the memory circuits. The example DUT 210 may provide pass/fail results to a graphics engine for presentation on a display, may provide the results to transceiver circuitry for communication over a network, etc.

In some examples, such as FIG. 2A, a DUT 206 is not implemented with circuitry capable of making pass/fail determinations on memory circuits and requires an external ATE to make the determinations. In other examples, such as FIG. 2B, a DUT 210 is implemented with diagnostic ATE circuitry and can make internal pass/fail determinations. While examples used herein may refer to the DUT 206 as described in FIG. 2A for simplicity, the teachings of this disclosure support DUTs with or without internal diagnostic ATE circuitry.

Figure 3:
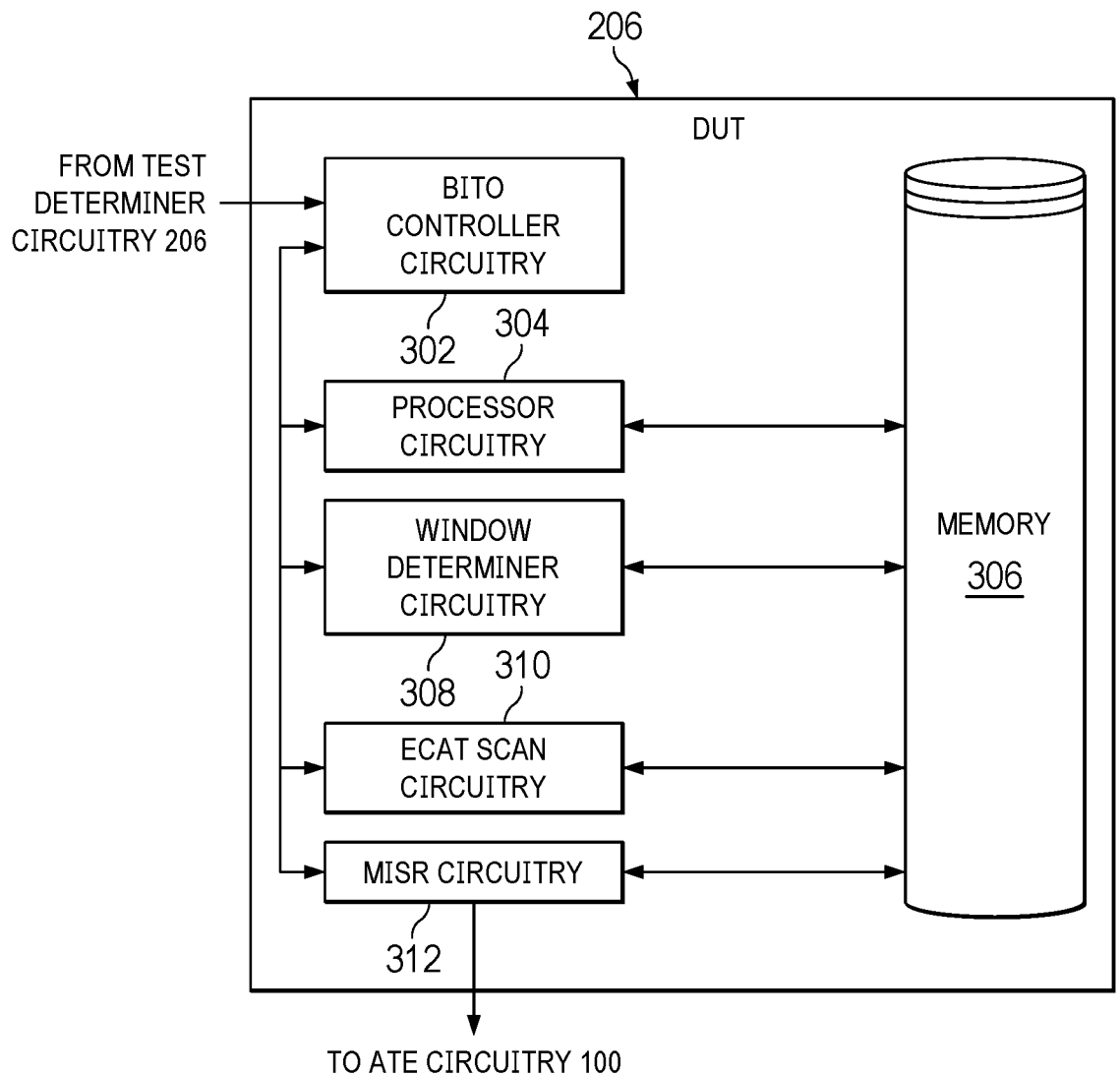
FIG. 3 is an example block diagram of the DUT of FIG. 2A.

FIG. 3 is an example block diagram of the DUT 206 of FIG. 2A. The example DUT 206 includes example BITO controller circuitry 302, example processor circuitry 304, example memory 306, example window determiner circuitry 308, example ECAT scan circuitry 310, and example MISR circuitry 312.

The example BITO controller circuitry 302 obtains the selected DV test from the test determiner circuitry 204. The BITO controller circuitry 302 manages the modification of the selected DV test to produce a greater number of observable memory values. To manage the test modification, the example BITO controller circuitry 302 may communicate with the other components of the DUT 206 to provide instructions and receive updates. Some of the instructions sent by the example BITO controller circuitry 302 to the internal components of the DUT 206 may be described as a state machine. The state machine is discussed further in connection with FIG. 9.

The example processor circuitry 304 executes machine readable instructions. For example, the processor circuitry 304 obtains the selected DV test and runs the test in its entirety. To run the test, the example processor circuitry 304 may make one or modifications to values within the example memory 306. The example processor circuitry 304 may additionally record how the values of one or more memory circuits change over time during execution of the selected DV test. The example processor circuitry 304 may be any type of processor circuitry as described previously.

The example memory 306 refers to all of the memory circuits within the example DUT 206. One or more of the memory circuits in the memory 306 may include experience faults during modifications from the processor circuitry 304. The percentage of faults within the example memory 306 that the example ATE circuitry 100 can make pass/fail determinations for is the stuck-at coverage of the example DUT 206. The example memory 306 may be include any type of memory circuits. For example, the example memory 306 may include a volatile memory and a non-volatile memory. The volatile memory may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory may be implemented by flash memory and/or any other desired type of memory device.

The example window determiner circuitry 308 analyzes the results of the first, completed DV test to determine a window of time within the DV test. To do so, the example window determiner circuitry 308 obtains the recorded change in memory values from the processor circuitry 304 and determines which memory circuits in the example memory 306 remain unobservable after the test completed. The example window determiner circuitry 308 then determines a period of time during the execution of the test in which a maximum number of the memory values that were unobservable at the end of the test are observable. As used above and herein, the period of time identified by the example window determiner circuitry 308 may be referred to as an observable time window.

In some examples, such as FIG. 3, the example DUT 206 implements the window determiner circuitry 308. In other examples, the example DUT 206 may not implement the window determiner circuitry 308. In such examples, the example window determiner circuitry 308 may be implemented within modified versions of the example test determiner circuitry 204, the example ATE circuitry 100, or any other circuitry external to the DUT 206. In such examples, the BITO controller circuitry 302 may obtain the recorded change in memory values from the example processor circuitry 304, transmit the record to the example window determiner circuitry 308, receive the observable time window from the example window determiner circuitry 308, and provide the observable time window to the processor circuitry 304. The example BITO controller circuitry 302 and example observable window determiner circuitry 308 may send and receive data from one another using any suitable communication protocol.

The example BITO controller circuitry 302 instructs the example processor circuitry 304 to reset the memory 306 to a state before the DV test was executed. The example BITO controller circuitry 302 further instructs the processor circuitry 304 to begin modifying values in the memory 306 according to the DV test a second time, and to stop test execution (i.e., stop modifying memory values) during the observable time window.

The example ECAT scan circuitry 310 selects a subset of values in the example memory 306 for use in a signature computation. To select the values, the example ECAT scan circuitry 310 forms scan chains with the memory values, compresses the scan chains, and masks unobservable values within the scan chains. The example ECAT scan circuitry 310 is discussed further in connection with FIG. 4.

The example MISR circuitry 312 computes a MISR value using the output of the ECAT scan circuitry 310. As used above and herein, a MISR value is a signature that is computed by compressing multiple input data streams into a single value. The MISR value computed using the output of the ECAT scan circuitry 310 may be referred to as a measured MISR value because it contains information that was measured, observed, obtained, strobed, etc. from the example memory 306 after the processor circuitry performed some or all of the modifications of the selected DV test.

The example MISR circuitry 312 may also compute an expected MISR value. An expected MISR value is a signature that represents values that the example memory 306 should contain after test execution if none of the memory circuits experienced a fault. The example BITO controller circuitry 302 may obtain the correct or expected values of the example memory 306 from the test determiner circuitry 204 with the selected DV test. In such examples, the BITO controller circuitry 302 may provide the correct or expected values of the example memory 306 to the example MISR circuitry 312 to calculate the expected MISR value.

The example MISR circuitry 312 provides the measured MISR value and the expected MISR value to the example ATE circuitry 100 for comparison. In examples where the DUT includes an internal ATE, such as the DUT 210, the example MISR circuitry 312 may provide the signature values to the diagnostic ATE circuitry 212 for comparison.

In some examples, the example BITO controller circuitry 302 does not instruct the MISR circuitry 312 to compute a measured or expected MISR value. In such examples, the ECAT scan circuitry 310 may produce both measured scan chains and expected scan chains. The measured scan chains represent the memory values as they are actually stored in the memory 306 after the example processor circuitry 304 performs some or all of the modifications of the selected DV test. In contrast, the expected scan chains represent values the memory circuits should store after test execution if none of the memory circuits exhibit a fault. The example ECAT scan circuitry 310 may compress and mask both the measured scan chains and expected scan chains to reduce the amount of data needed to describe the chains. Furthermore, in examples where MISR values are not computed, the example ECAT scan circuitry 310 provides the measured scan chains and the expected scan chains to the example ATE circuitry 100.

The example DUT 206 executes a modified DV test. In the modified DV test, the example ECAT scan circuitry 310 produces first measured scan chains from a first, complete test execution of the original, selected DV test and second measured scan chains from a second, partial test execution of the selected DV test. Advantageously, the processor circuitry 304 stops the second execution of the selected DV test at a time that enables the ECAT scan circuitry 310 to record some memory circuits that were unobservable in the first measured scan chains as observable in the second measured scan chains. The example MISR circuitry 312 then computes a measured MISR value based on both the first measured scan chains and the second measured can chains. In turn, the example ATE circuitry 100 may make a greater number of pass/fail determinations using the modified DV test than the original, selected DV test. As a result, the example DUT 206 may improve stuck-at-coverage based on the teachings of this disclosure.

Figure 4:
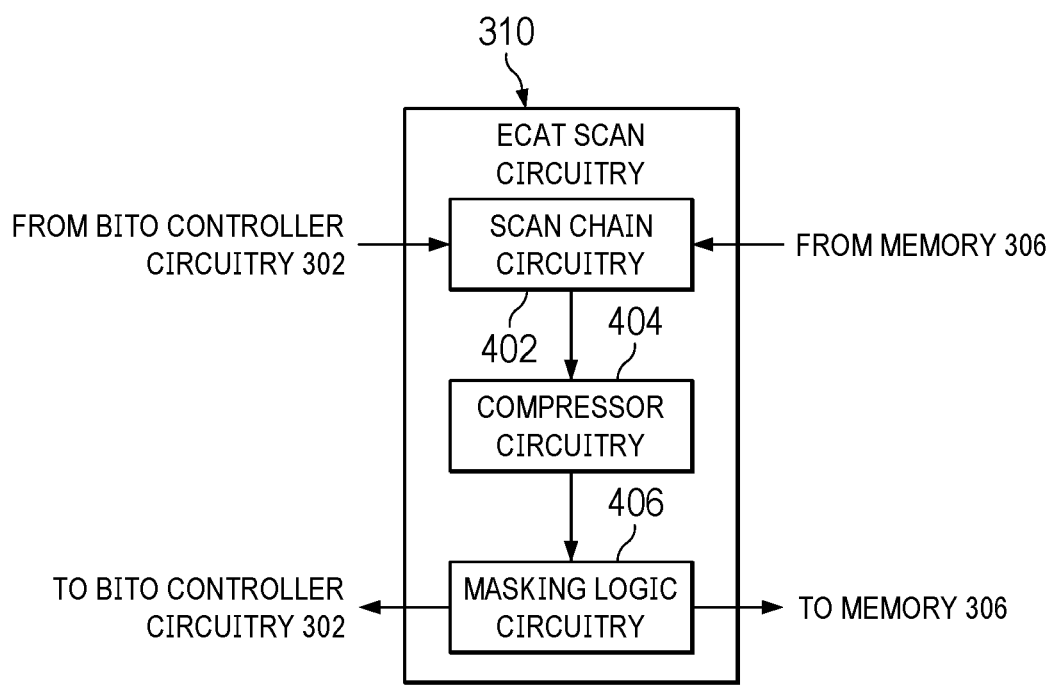
FIG. 4 is an example block diagram of the enhanced chip access trace (ECAT) scan circuitry of FIG. 3.

FIG. 4 is an example block diagram of the access enhanced chip access trace (ECAT) scan circuitry of FIG. 3. The example ECAT scan circuitry 310 includes example scan chain circuitry 402, example compressor circuitry 404 and example masking logic circuitry 406.

The example scan chain circuitry 402 receives an indication from the BITO controller circuitry 302 that execution has ended. Based on the indication, the example scan chain circuitry 402 forms scan chains using the contents of the memory circuits within the example memory 306. To form a scan chain, the example scan chain circuitry 402 may link together the values of memory circuits that are present in a given domain exercised during the operation of the DV test. For example, if the processor circuitry 304 adds two integer variables together and store the summation as a third integer variable as part of the DV test, the example scan chain circuitry 402 may link any memory circuit used to represent one of the three variables together in a scan chain.

The example compressor circuitry 404 obtains the scan chains from the example scan chain circuitry 402. In some examples, the compressor circuitry 404 may obtain the scan chain circuitry 402 by accessing a reserved portion of the memory 306, such as a cache, that stores links defining the scan chains. The example compressor circuitry 404 compresses the memory circuit contents in the scan chains, thereby reducing the total amount of data required to represent the information. The example compressor circuitry 404 implement exclusive OR (XOR) based compression to reduce the total amount of data. XOR based compression is a lossless technique used to compress floating point values by performing successive XOR operations so that only the difference between bits are stored. In other examples, the example compressor circuitry 404 may execute a different compression technique.

The example masking logic circuitry 406 masks the compressed memory circuit contents that are not observable. In doing so, instructions from the example masking logic circuitry 406 ensures that the example MISR circuitry 312 only computes a MISR value based off unmasked, observed memory values.

The example ECAT scan circuitry 310 implements an ECAT scan. During the ECAT scan, the example ECAT scan circuitry 310 obtains, compresses, and masks memory values so that a maximum amount of observable memory values are available for MISR computation. An example ECAT scan is discussed further in connection with FIG. 5.

Figure 5:
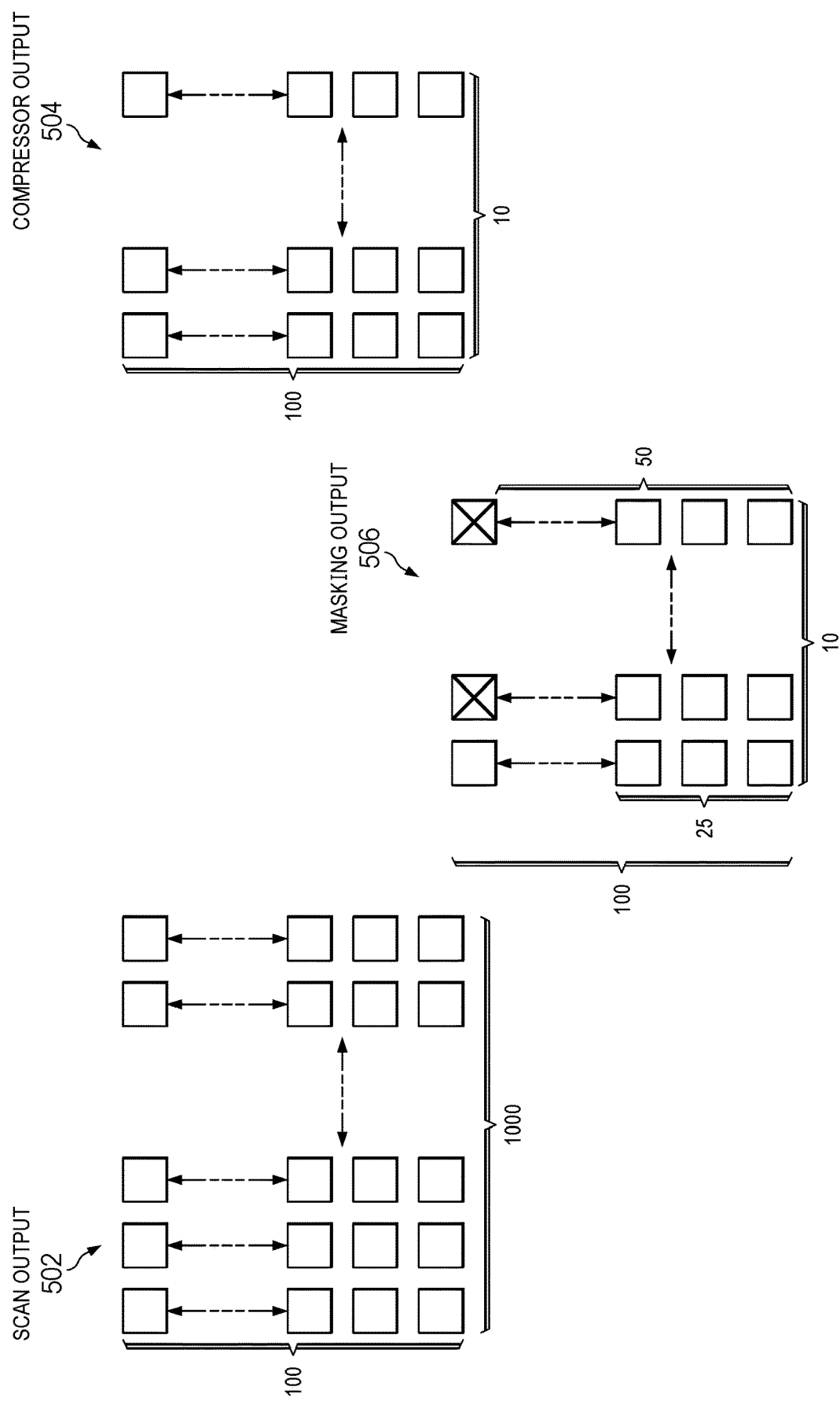
FIG. 5 is an illustrative example of operations executed by the ECAT scan circuitry of FIG. 4.

FIG. 5 is an illustrative example of operations executed by the ECAT scan circuitry 310 of FIG. 4. Specifically, FIG. 5 illustrates intermediate outputs that the ECAT scan circuitry 310 may produce when executing an ECAT scan. FIG. 5 includes a scan output 502, a compressor output 504, and a masking output 506. In the illustrative example of FIG. 5, the example ECAT scan circuitry 310 scans a total of 100,000 memory circuits from the example memory 306. The illustrative example of FIG. 5 uses 100,000 memory values for simplicity. In other examples, a different number of memory values may be scanned.

The scan output 502 represents the scan chains formed by the example scan chain circuitry 402. The scan chains contain values recorded from the example memory 306 during or after the test execution. For example, to produce the first measured scan chain as described in FIG. 3, the scan output 502 contains values from memory 306 after the selected DV test completed, whereas to produce the second measured scan chain, the scan output 502 contains values from the memory 306 during the observable time window. The example scan chain circuitry 402 may link together the values of memory circuits that are influenced by a given operation of the DV test to form scan chains.

An important performance factor of DV tests is the amount of time required to obtain results. Therefore, rather than requiring a signature computation of 100,000 memory values sequentially, the example MISR circuitry 312 determines a MISR value that uses parallel computation of each scan chain. As a result, the amount of time taken to compute a signature is limited by the length of the longest scan chain instead of the total number of memory values. To decrease the amount of time required to compute the MISR value, the example scan chain circuitry 402 may couple the memory circuits in a manner that maximizes the number of scan chains and minimizes the length of each scan chain. For example, in FIG. 5, the scan output 502 shows the 100,000 memory values as 1,000 scan chains that are each 100 memory values long. In other examples, the number of scan chains and length of each chain may be different and may depend on the total number of memory values to be stored.

The example compressor output 504 represents values in the example memory 306 after the example compressor circuitry 404 compresses the scan output 502. The example compressor circuitry 404 may use XOR compression to reduce the amount of data required to represent the observable memory values. For example, the example compressor output 504 shows that the 100,000 memory values, which were originally stored in 1,000 scan chains that are each 100 values in length, are compressed by the compressor circuitry 404 so that the same information can be represented in 10 scan chains that are each 100 values in length. In other examples, the number of scan chains compressed may be different and may depend on the type of compression and the total number of memory values to be stored. In some examples, the total amount of data used to compute a signature may be referred to as a volume of data.

The example masking output 506 represents values in the example memory 306 after the example masking logic circuitry 406 masks the compressor output 504. The MISR value may be represented as a single signature that accumulates and contains information from each memory value of each scan chain used as input. As a result, if the example MISR circuitry 312 uses a memory value that is unknown (i.e., memory values that were not observable) as an input to a MISR computation, the entire resulting signature may be corrupted. To prevent this, the example masking logic circuitry 406 masks the compressor output 504 to remove memory values that are unobservable. As a result, the length of one or more compressed scan chains may be reduced. For example, the masking output 506 shows that in the illustrative example of FIG. 5, a first scan chain remains 100 values in length, a second scan chain is reduced to 25 values in length, and a tenth scan chain is reduced to 50 scan chains in length. In other examples, the number of memory values masked may be different and may depend on the type of DV test run on the example DUT 206.

The example MISR circuitry 312 uses the masking output 506 and instructions from the BITO controller circuitry 302 to perform a MISR computation. The ECAT scan circuitry 310 processes values in the memory 306 before signature computation to minimize the amount of time required to compute the signature, minimize the amount of memory required to compute the signature, and ensure that the signature is not corrupted by unobservable memory values.

Figure 6:
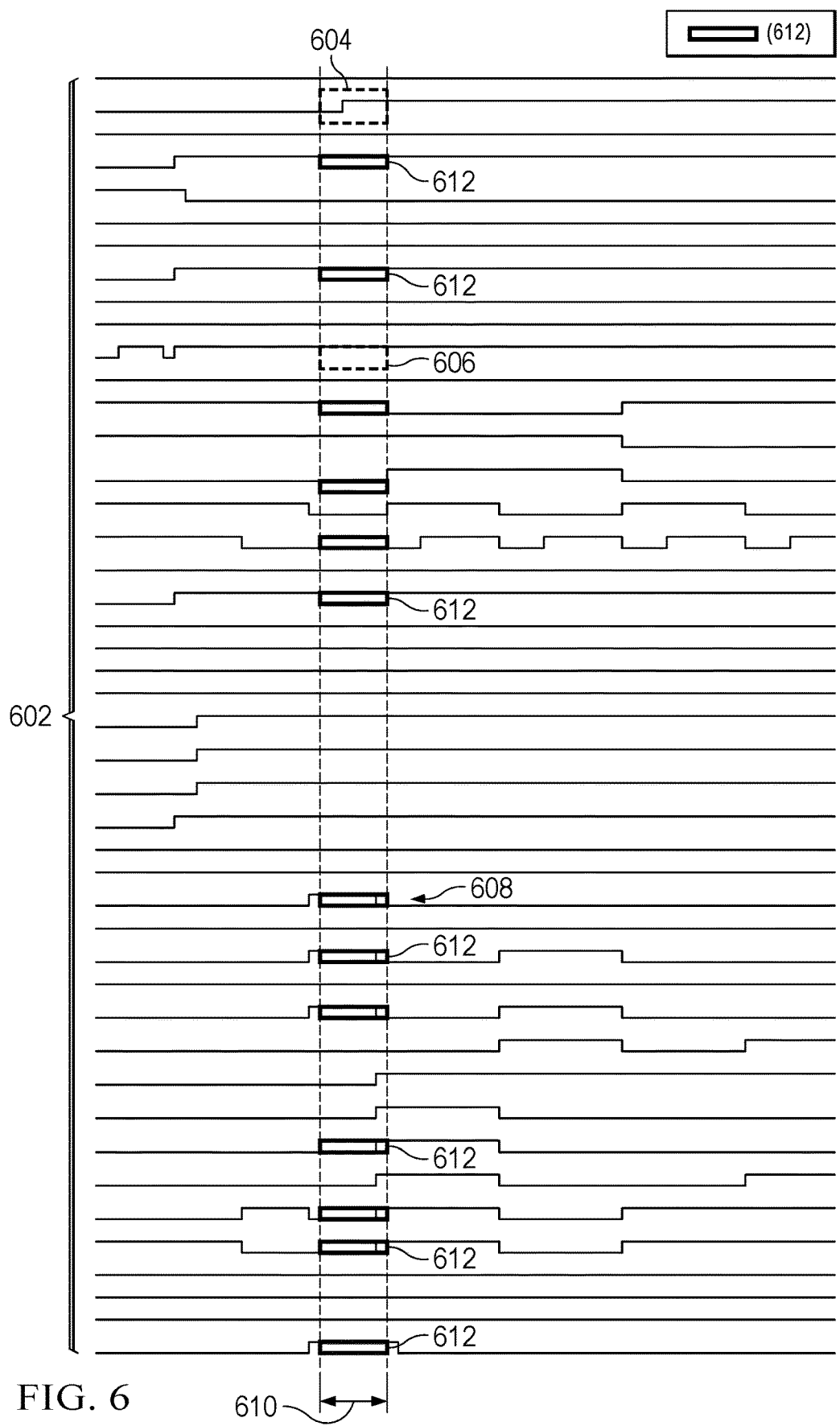
FIG. 6 is an illustrative example of operations performed by the window determiner circuitry of FIG. 3.

FIG. 6 is an illustrative example of operations performed by the example window determiner circuitry 308 of FIG. 3. FIG. 6 includes example signals 602, a first example 604, a second example 606, a third example 608, and an example time window 610.

The example signals 602 represent how the digital values stored in the memory circuits of the example DUT 206 change over time. In each of the example signals 602, a high value represents a digital '1' and a low value represents a digital '0'. In response to an operation performed by the DUT 206 as part of the DV test, a given signal may transition, indicating the values of a memory circuit has changed. The example signals 602 do not represent the digital values of every memory circuit in the memory 306. Instead, they represent the memory values that were unobservable within the results of the first, completed DV test.

The memory values represented by the example signals 602 change according to a first clock used by the memory 306. The first clock may operate at a different frequency than a second clock used by the example processor circuitry 304 to modify the values in memory. If the frequency of the first clock is greater than the frequency of the second clock, then the exact cycle at which the value of a memory circuit is read cannot be precisely determined. For example, if the example memory 306 changes values based on a 2 GHz clock, but the example processor circuitry 304 stops execution and reads memory values based on a 1 GHz clock, the processor circuitry 304 may stop the execution at one of two adjacent clock pulses by the DUT 206. As a result, in the foregoing example, a 2 nanosecond period exists where the values in the memory 306 are indeterminate. The intermediate memory duration may last for any amount of time. The illustrative example of FIG. 6, the example time window 610 illustrates the intermediate memory duration lasting approximately 100 nanoseconds (ns).

The example window determiner circuitry 308 calculates the length of the indeterminate memory duration based on the clock frequencies of the example memory 306 and the example processor circuitry 304. The example window determiner circuitry 308 then determines a position of the indeterminate memory duration on the example signals 602 that exhibits a maximum number of observations. An observation occurs when the example window determiner circuitry 308 is able to determine that a signal does or does not contain a fault at that particular time. The example window determiner circuitry 308 may observe any type of fault that changes a memory value. For example, faults identifiable by the example window determiner circuitry 308 include, but are not limited to, stuck-at-1 faults, stuck-at-0 faults, dynamic faults, multi-port faults, etc. Additionally, the example window determiner circuitry 308 may only count a stuck-at-1 fault or a stuck-at-0 fault as an observation if the signal is stable (i.e., does not change values during the window).

In the first example 604, an observation will not occur because the selected signal is not stable includes a transition during the example time window 610. As a result, when the example scan chain circuitry 402 scans the memory circuits of the example DUT 206 during the observable time window, it could store the value of the signal selected in the first example 604 as either a digital '0' or a digital '1'. Therefore, even though BITO controller circuitry 302 knows the expected value of the memory circuit over time, it cannot determine whether it should use a '0' or a '1' to represent the foregoing memory circuit during the computation of the expected MISR value.

In the second example 606, the selected signal is stable, but the signal corresponds to a memory circuit that was not modified or influenced by the DV test. As a result, the example window determiner circuitry 308 determines an observation will not occur. An observation will not occur because there are no expected values for memory circuits that are unaffected by the DV test, and thus no value to compare the selected signal against to determine a fault.

In the third example 608, the selected signal is stable. Additionally, the expected value of the selected memory circuit during the time window 610 (i.e., a digital '1') does not match the measured value of the selected memory circuit during the same time period (i.e., a digital '0'). Furthermore, the selected signal corresponds to a memory circuit that was influenced by the DV test. As a result, the example window determiner circuitry 308 determines an observation will occur. An observation will occur in the third example 608 because, if the measured MISR value is calculated based of the values from the time window 610, the example ATE circuitry 100 can compare the measured MISR value to the expected MISR value to determine the selected memory circuit experienced a stuck-at-0 fault.

In the illustrative example of FIG. 6, the example window determiner circuitry 308 determines an observation will occur for each of the observable signals 612 during the time window 610. The position of the indeterminate memory duration that results the in the greatest number of observable signals 612 is referred to as the observable time window. In the illustrative example of FIG. 6, the example window determiner circuitry 308 determines time window 610, which is positioned between approximately 2,170,380 ns and 2,170,480 ns in the example timeline, to be the observable time window.

To improve observability, the example processor circuitry 304 may run the selected DV test on the DUT 206 over multiple iterations and stop execution of the test at different times. In some examples, running a test on the example DUT 206 may be referred to a test simulation or test execution. After each test execution, the example ECAT scan circuitry 310 may scan, compress, and mask the memory circuits so that only the memory circuits that were observable in that particular execution (i.e., the memory circuits whose values at the time execution stopped can be used by the ATE circuitry 100 to determine whether or not a fault occurred) are used as inputs to the MISR computation. Furthermore, the example window determiner circuitry 308 iteratively adjusts the observable time window so that an nth execution of the DV test is stopped at a time that maximizes the number of observable signals 612 from the set of signals that have yet to exhibit a fault in any of the 1st through the (n−1)th tests. In doing so, each execution of the DV test increases the total number of observable memory values of the example DUT 206. As a result, the example DUT 206 may exhibit a higher stuck-at coverage than a DUT that that did not observe the additional memory values.

Figure 7:
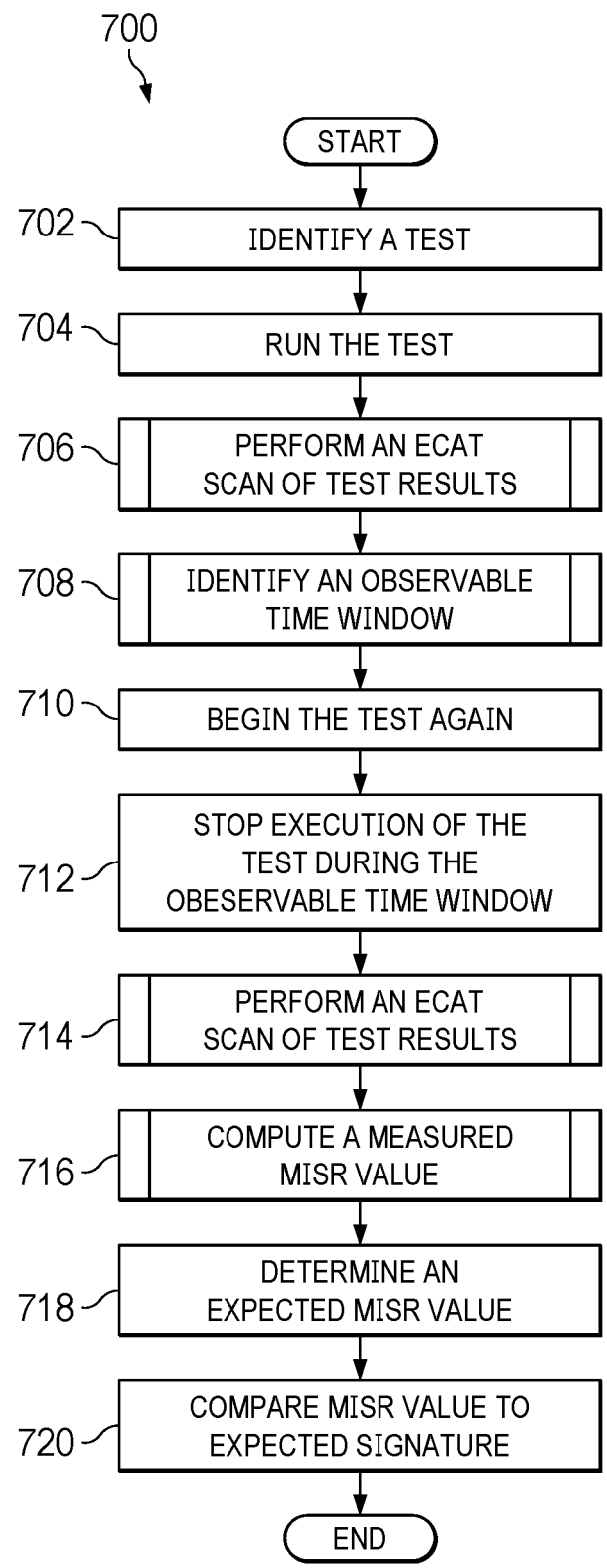
FIG. 7 is a flowchart representative of an example process that may be performed using machine readable instructions that can be executed and/or hardware configured to implement the computer circuitry of FIG. 2A to test the device under test (DUT) of FIG. 2A.

FIG. 7 is a flowchart representative of an example process that may be performed using machine readable instructions that can be executed and/or hardware configured to implement the computer circuitry of FIG. 2A or FIG. 2B to test the DUT of FIG. 2A or FIG. 2B. The example machine readable instructions and/or operations 700 begin when the example test determiner circuitry 204 identifies a test. (Block 702). For example, the example test determiner circuitry 204 may identify a DV test from the ATPG database 202.

The example processor circuitry 304 runs the test from block 702 on the example DUT 206. (Block 704). To run the test, the example processor circuitry 304 may perform a series of operations that cause modifications to the example memory 306. The values of memory circuits within the DUT 206 may change over time due to the performance of the operations.

The example ECAT scan circuitry 310 performs an ECAT scan of the memory circuits of the DUT 206. (Block 706). The example ECAT scan circuitry 310 may execute the machine readable instructions and/or operations of block 706 based on instructions provided by the BITO controller circuitry 302. The instructions provided by the BITO controller circuitry 302 may be described as a state machine. Block 706 is discussed further in connection with FIG. 9.

The example window determiner circuitry 308 determines an observable time window. (Block 708). The example window determiner circuitry 308 uses the results of the test execution from block 704 to determine the observable time window. Block 708 is discussed further in connection with FIG. 8.

The example processor circuitry 304 begins the test again. (Block 710). To begin the test, the example processor circuitry 304 may reset the memory 306 to an initial state. The example processor circuitry 304 may then perform the same modifications to the example memory 306 as described in connection to block 704.

The example processor circuitry 304 stops execution of the test during the observable time window. (Block 712). As a result, the memory circuits in the memory 306 store values caused by operations that proceeded up to, but do not pass, the observable time window.

The example ECAT scan circuitry 310 performs an ECAT scan of the memory circuits of the DUT 206. (Block 714). The ECAT scan circuitry 310 may execute the machine readable instructions and/or operations of block 714 based on instructions provided by the BITO controller circuitry 302. Block 716 is discussed further in connection with FIG. 9.

The example MISR circuitry 312 computes a measured MISR value. (Block 716). The MISR circuitry 312 may execute the machine readable instructions and/or operations of block 716 based on instructions provided by the BITO controller circuitry 302. The instructions provided by the BITO controller circuitry 302 may be described as a state machine. The state machine and block 716 are described further in connection with FIG. 9.

The example MISR circuitry 312 determines an expected MISR value. (Block 718). The expected MISR value is a signature that represents the expected values of observable memory circuits from the first test execution of block 704, as well as the expected values of observable memory circuitry from the second test execution that stopped at block 712. In some examples, the example MISR circuitry 312 may determine the signature of block 718 by providing the expected memory values to the MISR circuitry 312 to produce an expected MISR.

The example ATE circuitry 100 compares the measured MISR value of block 716 to the expected MISR value of block 718. (Block 720). The example ATE circuitry 100 may compare the signatures to determine which memory circuits exhibited a fault. If the example machine readable instructions and/or operations are executed by the computer circuitry 208 of FIG. 2B rather than the example computer circuitry 200 of FIG. 2A, the example diagnostic ATE circuitry 212 performs the comparison of block 720 instead of the example ATE circuitry 100. The example machine readable instructions and/or operations 700 end after block 720.

The example machine readable instructions and/or operations 700 describe computer circuitry (e.g., either example computer circuitry 200 or computer circuitry 208) that runs a test on a DUT (e.g., either DUT 206 or DUT 210) a first time entirely, at block 704, and a second time partially at block 710 and 712. In some examples, however, the example BITO controller circuitry 302 may provide instructions to run the test on the DUT 206 more than twice. The example BITO controller circuitry 302 may provide such instructions in order to achieve a higher stuck-at coverage.

If the example BITO controller circuitry 302 determines the DUT 206 should be run on the example DUT 206 a (n+1)th time, the example ECAT scan circuitry 310 may still perform an ECAT scan on the results of the nth execution at block 714. However, the MISR circuitry 312 may not calculate a measured MISR value after the nth execution at block 716. Instead, in such examples, the example machine readable instructions and/or operations 700 may loop from block 714 back to block 708, where the example window determiner circuitry 308 determines a new observable time window that will be used to stop the (n+1)th execution. The example machine readable instructions and/or operations 700 would then proceed through blocks 710, 712, and 714 as described previously. Then, if the BITO controller circuitry 302 determines a (n+2)th execution of the test on the DUT 206 is not required, the example MISR circuitry 312 may perform the MISR computation of block 716 based on the observable memory values from all previous test executions. Once the measured MISR value is computed at block 716, the example machine readable instructions and/or operations proceed to block 718 as described previously.

Figure 8:
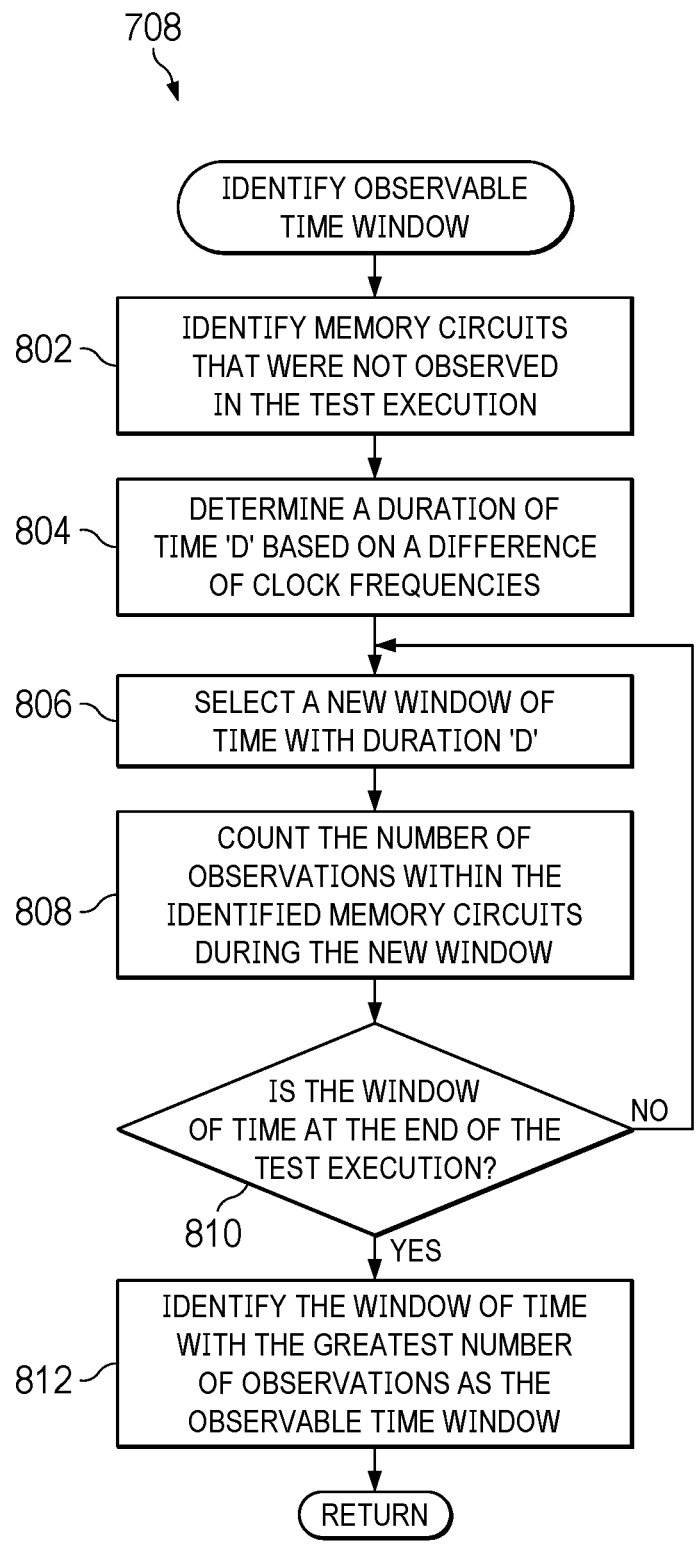
FIG. 8 is a flowchart representative of an example process that may be performed using machine readable instructions that can be executed and/or hardware configured to implement the window determiner circuitry of FIG. 3, and/or, more the test modifier circuitry of FIG. 1 to identify an observable time window as described in FIG. 7.

FIG. 8 is a flowchart representative of an example process that may be performed using machine readable instructions that can be executed and/or hardware configured to implement the window determiner circuitry of FIG. 3, and/or, more the test modifier circuitry of FIG. 1 to identify an observable time window as described in FIG. 7. Specifically, FIG. 8 describes how the machine readable instructions and/or operations 700 implement block 708 of FIG. 7. Implementation of block 708 begins when the example window determiner circuitry 308 identifies memory circuits that were not observed in the test execution of block 704. (Block 802). The example window determiner circuitry 308 identifies memory circuits that remain unobserved from the previous test simulations. For example, in the first instance that block 802 is implemented, the example window determiner circuitry 308 only uses the ECAT scan from block 706 (i.e., the results of the first test execution) to determine which memory values remain unobserved. In examples where the example BITO controller circuitry 302 decides to run the test on the DUT 206 more than twice, block 706 may be implemented more than once. In such examples, in the second instance that block 802 is implemented, the example window determiner circuitry 308 would use the ECAT scans from both block 706 and block 714 (i.e., the results of both the first and second test execution) to determine which memory values remain unobserved.

The example window determiner circuitry 308 determines a duration of time D based on a difference of clock frequencies. (Block 804). Specifically, the duration of time D of block 804 refers to the indeterminate memory duration described previously in connection to FIG. 6. The example window determiner circuitry 308 compares the frequency of the clock used by the memory 306 to values with the frequency of the clock used by the processor circuitry 304 to stop execution of a test. The example window determiner circuitry 308 uses the difference in clock frequencies to identify the duration of time D.

The example window determiner circuitry 308 selects a window of time with duration D. (Block 806). Specifically, the example window determiner circuitry 308 selects the window of time from the history of memory value changes in the first, completed test execution of block 704. On a first implementation of block 806, the example window determiner circuitry 308 selects the window of time at the beginning of the history of memory value changes. When described using timestamps, the first window of time may be written as [0, D]. On subsequent implementations of block 806, the example window determiner circuitry 308 selects a window of time that is adjacent to the previous window. For example, the second window time may be described as [D, 2D], the third window of time may be described as [2D, 3D], etc.

The example window determiner circuitry 308 counts the number of faults observed in the memory circuits of block 802 during the window of time of block 806. (Block 808). The example window determiner circuitry 308 may use any number of techniques to identify and count a variety of faults as described previously in connection to FIG. 6.

The example window determiner circuitry 308 determines whether the window of time of block 806 is at the end of the history of memory value changes in the first, completed test execution of block 704. (Block 810). If the example window determiner circuitry 308 determines the window of time is not at the end of the history of memory value changes (Block 810: No), the example machine readable instructions and/or operations 700 loop to block 706, where the example window determiner circuitry 308 selects a new window of time with duration D.

If the example window determiner circuitry 308 determines the window of time is at the end of the history of memory value changes (Block 810: Yes), the example window determiner circuitry 308 identifies the window of time with the greatest number of observations as the observable time window. (Block 812). The example machine readable instructions and/or operations 700 return to block 708 after block 812.

Figure 9:
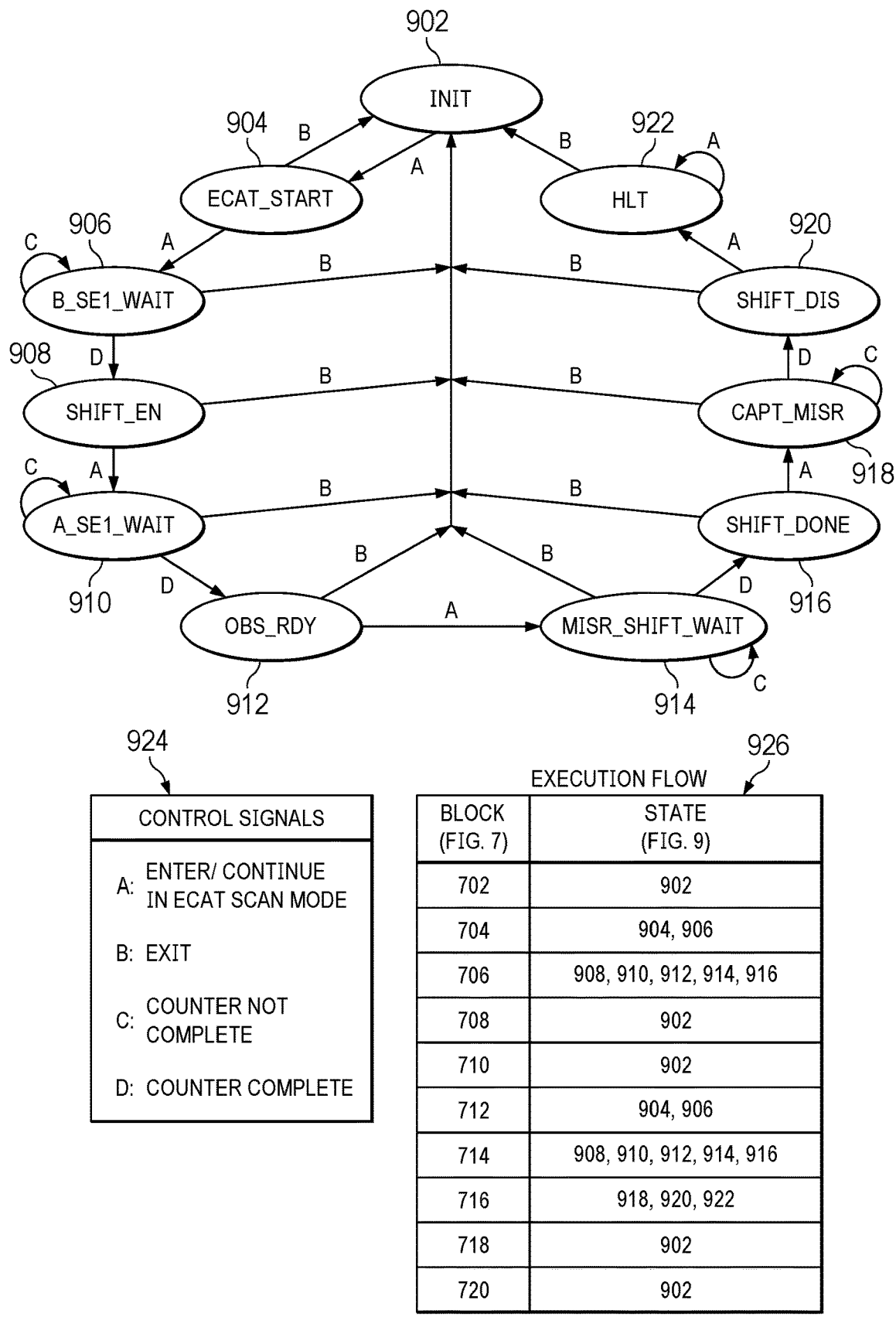
FIG. 9 is a state machine representative of an example process that may be performed using machine readable instructions that can be executed and/or hardware configured to implement the BITO controller circuitry of FIG. 3 to perform an ECAT scan and compute a measured a multiple input signature register (MISR) value as described in FIG. 7.

FIG. 9 is a state machine representative of an example process that may be performed using machine readable instructions that can be executed and/or hardware configured to implement the BITO controller circuitry of FIG. 4, and/or, more generally, the test modifier circuitry of FIG. 2A to initiate an ECAT scan and a measured MISR value as described in FIG. 7. Specifically, FIG. 9 illustrates a state machine that describes how the example BITO controller circuitry 302 implements the state machine to control the test modification of FIG. 7. FIG. 9 includes example states 902, 904, 906, 908, 910, 912, 914, 916, 918, 920, 922, example control signals 1024, and an example execution flow table 1026.

The example state 902, described in FIG. 9 as "INIT", is an initial state. In the initial state, neither of the example ECAT scan circuitry 310 or MISR circuitry 312 perform operations. In some examples, the computer circuitry 200 and/or computer circuitry 208 may be referred to as in a functional mode when in the example state 902. The example computer circuitry 200 and/or example computer circuitry 208 may be in state 902 when implementing blocks 702 and 704 of FIG. 7.

The example state 904, described in FIG. 9 as "ECAT_START", refers to when the BITO controller circuitry 302 sends instructions to the processor circuitry 304 to stop execution of a DV test in progress. In some examples, the DUT 206 further includes clock gate circuitry. The clock gate circuitry may allow the processor circuitry 304 to execute operations according to the DV test when enabled and may stop or prevent the processor circuitry 304 from executing additional operations according to the DV test when disabled. In some cases, enabling of the clock gate may be indicated as opening of the clock gate and disabling of the clock gate may be indicated as closing of the clock gate. In such examples, the BITO controller circuitry 302 provides instructions to the gate circuitry during the example state 904. The provided instructions cause the gate circuitry to close, thereby stopping execution of the DV test. In some examples, the computer circuitry 200 and/or computer circuitry 208 may be referred to as having entered an ECAT scan mode when the BITO controller circuitry 302 enters state 904.

The example state 906, described in FIG. 9 as "B_SE1_WAIT", refers to when the BITO controller circuitry 302 waits a number of clock cycles before entering a scan shift mode. The number of clock cycles in the example state 906 may be predetermined by a manufacturer. The example BITO controller circuitry 302 may wait to enter a scan shift mode during state 906 in order to allow smooth state transition, which may be needed to ensure settling times for certain signals with large propagation delay.

The example state 908, described in FIG. 9 as "SHIFT_EN", refers to when the BITO controller circuitry 302 sends instructions to the example scan chain circuitry 402 to begin scanning the memory values from the example memory 306 into scan chains. In some examples, state 908 may be described as the entrance of a scan shift mode.

The example state 910, described in FIG. 9 as "A_SE1_WAIT", refers to when the example BITO controller circuitry 302 waits a number of clock cycles before entering state 912. During the amount of time that the example BITO controller circuitry 302 waits in state 910, the example ECAT scan circuitry 310 may complete scanning the example memory values from the example memory 306, compressing the scan chains, and masking the unobservable memory values as discussed previously in connection with FIGS. 5, 6. The number of clock cycles in state 910 may be based on the length of the scan chains.

The example state 912, described in FIG. 9 as "OBS_RDY", refers to when the example BITO controller circuitry 302 sends instructions to the ECAT scan circuitry 310 to begin shifting the masking output 506 to a section of the example memory 306 accessible by the MISR circuitry 312. In some examples, the section of the example memory 306 accessible by the MISR circuitry 312 is referred to as MISR registers.

The example state 914, described in FIG. 9 as "MISR_SHIFT_WAIT", refers to when the example BITO controller circuitry 302 waits a number of clock cycles for the ECAT scan circuitry 310 to perform the process of shifting the masking output 506 into the MISR registers. The number of block cycles of state 914 may be determined by the length of the compressed, masked scan chains in the masked output 506. Similarly, the example state 916, described in FIG. 9 as "SHIFT_DONE", refers to when the ECAT scan circuitry 310 has finished shifting the masking output 506 into the MISR registers.

The example state 918, described in FIG. 9 as "CAPT_MISR", refers to when the example BITO controller circuitry 302 sends instructions to the MISR circuitry 312 to compute the MISR value reconfigure the design under test from scan mode back to functional mode and may also disable the corresponding elements needed for test result observation such as MISR. The MISR circuitry 312 uses the values stored in the MISR registers as inputs to the MISR computation. The example BITO controller circuitry 302 may stay in the example state 918 for an amount of time while the example MISR circuitry 312 completes the computation.

The example state 920, described in FIG. 9 as "SHIFT_DIS", refers to when the example BITO controller circuitry 302 provides instructions to the ECAT scan circuitry 310 to disable the scan shift mode. To disable the scan shift mode, the example ECAT scan circuitry 310 may begin one or more operations to close communication channels with the with the example memory 306.

The example state 922, described in FIG. 9 as "HLT", refers to when the example BITO controller circuitry 302 waits until the ECAT scan circuitry 310 has disabled the ECAT scan mode before returning to state 902. The amount of time in which the example BITO controller circuitry 302 waits may be dependent on the time required for the ECAT scan circuitry 310 to complete the operations that start in state 920.

The example control signals 924 describe how the BITO controller circuitry 302 transitions between states in the state machine of FIG. 9. For example, when the BITO controller circuitry 302 receives the control signal labelled 'A', the controller enters or continues in ECAT scan mode based on the current state. Additionally, when the example BITO controller circuitry 302 receives the control signal labelled 'B', the controller exits the current state and transitions to the initial state (state 902). Furthermore, when the example BITO controller circuitry 302 receives the control signal labelled 'C', a counter corresponding to the current state has not completed. In such examples, a counter may describe a variable that reaches a threshold number and completes after the number of clock cycles describes in states 910, 914, 918. Similarly, when the example BITO controller circuitry 302 receives the control signal labelled 'D', the counter corresponding to the current state has completed.

The example execution workflow 926 describes the one or more states that the BITO controller circuitry 302 is in when the computer circuitry 200 executes the machine readable instructions and/or operations 700. For example, the execution workflow table 1026 shows that when the example machine readable instructions and/or operations 700 start at block 702 to select a test, the BITO controller circuitry 302 is in state 902 (i.e., the initial state). Furthermore, after the processor circuitry 304 runs the test at block 704, the example BITO controller circuitry 302 transitions from state 902 to state 904, and from state 904 to state 906. Then, when the example ECAT scan circuitry 310 performs the ECAT scan of block 706, the example BITO controller circuitry 302 transitions from states 906 through states 908, 910, 912, 914, and 916. The example BITO controller circuitry 302 transitions to and stays in the example state 902 for blocks 708 and 710 of FIG. 7, in which the example window determiner circuitry 308 identifies an observable time window and the processor circuitry 304 begins a second execution of the DV test. When the example processor circuitry 304 stops the second execution of the DV test during the observable time window at block 712, the example BITO controller circuitry 302 transitions from state 902, to state 904, to state 906. During the ECAT scan of block 714, the example BITO controller circuitry 302 again transitions from states 906 through states 908, 910, 912, 914, and 916. Then, when the example MISR circuitry 312 computes a measured MISR value at block 716, the example BITO controller circuitry 302 transitions from state 916 through states 918, 920, 922. The example BITO controller circuitry 302 exits to state 922 when computing the expected signature in block 718 and when the example ATE circuitry 100 compares signatures at block 720. In some examples, components of the example DUT 206 may perform the operations described by blocks 704, 706, 712-716 because of instructions sent by the BITO controller circuitry 302 while in one of the states illustrated in FIG. 9.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein increase the observable memory values in a DUT. After a test is fully simulated on the DUT, the example apparatus identifies an observable time window that indicates when the greatest number of remaining unobserved memory values will become observable. The example apparatus starts an additional test simulation and stops its execution during the observable time window. The example apparatus then performs an ECAT scan to store, compress, and mask values from the DUT in their current state. The example apparatus computes a MISR value that uses ECAT scan results from multiple simulations. In doing so, the example apparatus computes a MISR value that represents the memory values observed in each test simulation. As a result, the example apparatus produces a greater number of observable memory values and increases the stuck-at coverage of a DUT when compared to previous solutions to identify faults.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the terms non-transitory computer readable medium, non-transitory computer readable storage medium, non-transitory machine readable medium, and non-transitory machine readable storage medium are expressly defined to include any type of computer readable storage device and/or storage disk and to exclude propagating signals and to exclude transmission media. As used herein, the terms "computer readable storage device" and "machine readable storage device" are defined to include any physical (mechanical and/or electrical) structure to store information, but to exclude propagating signals and to exclude transmission media. Examples of computer readable storage devices and machine readable storage devices include random access memory of any type, read only memory of any type, solid state memory, flash memory, optical discs, magnetic disks, disk drives, and/or redundant array of independent disks (RAID) systems.

Modifications are possible in the described embodiments, and other embodiments are possible, within the scope of the claims.

What is claimed is:

1. A device, comprising:
  built in test observation (BITO) controller circuitry configured to:
    cause a processor to execute instructions of a first test to modify values of a plurality of memory circuits; and
    cause the processor to execute instructions of a second test, wherein the second test is a partial portion of the first test, and wherein the values of one or more memory circuits of the plurality of memory circuits that are unobservable after the first test are observable during the second test;
  scan circuitry configured to select a subset of the values from the plurality of memory circuits based on the second test; and
  signature circuitry configured to:
    determine a logic signature based on the subset of the values, wherein a difference between the logic signature and an expected signature indicates a fault in the processor.

2. The device of claim 1, wherein to select the subset of the values from the plurality of memory circuits, the scan circuitry is further configured to:
  store the values from the plurality of memory circuits into a first amount of chains;
  compress the first amount of chains into a second amount of chains, wherein the second amount is less than the first amount; and
  mask the values corresponding to one or more unobservable memory circuits of the plurality of memory circuits from the second amount of chains to form the selected subset.

3. The device of claim 2, wherein to store the values from the plurality of memory circuits into the first amount of chains, the scan circuitry is further configured to:
  obtain the values from the plurality of memory circuits; and
  link the obtained values to generate the first amount of chains.

4. The device of claim 1, wherein:
  the scan circuitry is further configured to store the selected subset of the values in a multiple input signature register (MISR); and
  the signature circuitry is further configured to determine the logic signature using the MISR.

5. The device of claim 1, wherein:
  the signature circuitry is further configured to provide the logic signature to automatic test equipment (ATE) circuitry to determine whether the fault exists in the processor based on comparison of the logic signature with the expected signature.

6. The device of claim 1, wherein the device is a system on a chip (SOC).

7. The device of claim 1, further comprising:
  window determiner circuitry configured to determine a duration of the partial portion based on frequencies of a first clock of the processor and a second clock of the plurality of memory circuits.

8. The device of claim 7, wherein to determine the second test,
  the BITO controller circuitry is further configured to cause the processor to execute a plurality of tests on the plurality of memory circuits, wherein each of the plurality of tests is a respective partial portion of the first test, and wherein a duration of each respective partial portion is equal to the determined duration; and
  the window determiner circuitry is further configured to identify the second test from the plurality of tests, such that the second test provides a maximum number of observable memory circuits.

9. The device of claim 1, wherein each of the plurality of memory circuits is configured to store one single binary value.

10. A method, comprising:
  executing first instructions by a processor to perform a first test to modify values of a plurality of memory circuits;
  executing second instructions by the processor to perform a second test on the plurality of memory circuits, wherein the second test is a partial portion of the first test, and wherein the values of one or more memory circuits of the plurality of memory circuits that are unobservable after the first test are observable during the second test;
  selecting a subset of the values from the plurality of memory circuits based on the second test;
  determining a logic signature based on the subset of the values; and
  determining whether a fault exists in the processor based on the logic signature.

11. The method of claim 10, wherein selecting the subset of the values from the plurality of memory circuits further includes:
  storing the values from the plurality of memory circuits into a first amount of chains;
  compressing the first amount of chains into a second amount of chains, wherein the second amount is less than the first amount; and
  masking the values corresponding to one or more unobservable memory circuits of the plurality of memory circuits from the second amount of chains to form the selected subset.

12. The method of claim 10, further comprising:
storing the selected subset of the values in a multiple input signature register (MISR); and
determining the logic signature using the MISR.

13. The method of claim 10, further comprising:
determining a duration of the partial portion based on frequencies of a first clock of the processor and a second clock of the plurality of memory circuits.

14. The method of claim 13, wherein determining the second test comprises:
executing third instructions by the processor to perform a plurality of tests on the plurality of memory circuits, wherein each of the plurality of tests is a respective partial portion of the first test, and wherein a duration of each respective partial portion is equal to the determined duration; and
identifying the second test from the plurality of tests, such that the second test provides a maximum number of observable memory circuits.

15. A non-transitory machine readable medium comprising instructions that, when executed, cause at least one processor to:
cause a processor to execute first instructions to perform a first test to modify values of a plurality of memory circuits;
cause the processor to execute second instructions to perform a second test on the plurality of memory circuits, wherein the second test is a partial portion of the first test, and wherein the values of one or more memory circuits of the plurality of memory circuits that are unobservable after the first test are observable during the second test;
select a subset of the values from the plurality of memory circuits based on the second test;
determine a logic signature based on the subset of the values; and
cause a determination to be made whether a fault exists in the processor based on the logic signature.

16. The non-transitory machine readable medium of claim 15, wherein to select the subset of the values from the plurality of memory circuits, the instructions, when executed, cause the at least one processor to:
store the values from the plurality of memory circuits into a first amount of chains;
compress the first amount of chains into a second amount of chains, the second amount being less than the first amount; and
mask the values corresponding to one or more unobservable memory circuits of the plurality of memory circuits from the second amount of chains to form the selected subset.

17. The non-transitory machine readable medium of claim 15, wherein the instructions, when executed, cause the at least one processor to:
store the selected subset of the values in a multiple input signature register (MISR); and
determine the logic signature using the MISR.

18. The non-transitory machine readable medium of claim 15, further wherein the instructions, when executed, cause the at least one processor to:
determine a duration of the partial portion based on frequencies of a first clock of the processor and a second clock of the plurality of memory circuits.

19. The non-transitory machine readable medium of claim 18, wherein to determine the second test, the instructions, when executed, cause the at least one processor to:
cause the processor to execute third instructions to perform a plurality of tests on the plurality of memory circuits, wherein each of the plurality of tests is a respective partial portion of the first test, and wherein a duration of each respective partial portion is equal to the determined duration; and
identify the second test from the plurality of tests, such that the second test provides a maximum number of observable memory circuits.

20. The non-transitory machine readable medium of claim 16, wherein to store the values from the plurality of memory circuits into the first amount of chains, the instructions, when executed, cause the at least one processor to:
obtain the values from the plurality of memory circuits; and
link the obtained values to generate the first amount of chains.

* * * * *